(12) United States Patent
Esch

(10) Patent No.: US 11,171,458 B2
(45) Date of Patent: Nov. 9, 2021

(54) CONTACT ELEMENT, POWER SEMICONDUCTOR MODULE WITH A CONTACT ELEMENT AND METHOD FOR PRODUCING A CONTACT ELEMENT

(71) Applicant: Infineon Technologies AG, Neubiberg (DE)

(72) Inventor: Juergen Esch, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/666,615

(22) Filed: Oct. 29, 2019

(65) Prior Publication Data

US 2020/0136332 A1 Apr. 30, 2020

(30) Foreign Application Priority Data

Oct. 30, 2018 (DE) .......................... 102018127045.3

(51) Int. Cl.
*H01R 43/16* (2006.01)
*H01L 25/07* (2006.01)
(Continued)

(52) U.S. Cl.
CPC ............ *H01R 43/16* (2013.01); *H01L 25/07* (2013.01); *H01R 13/22* (2013.01); *H01R 25/161* (2013.01)

(58) Field of Classification Search
CPC ........ H01R 43/16; H01R 13/22; H01R 25/16; H01R 25/161; H01L 25/07
See application file for complete search history.

(56) References Cited

U.S. PATENT DOCUMENTS 6,791,207 B2 * 9/2004 Yoshida .............. B60R 16/0315
  307/10.1
6,921,969 B2 * 7/2005 Knapp ................ H01L 21/4875
  257/704
(Continued)

FOREIGN PATENT DOCUMENTS

DE 102008036112 A1 2/2009
DE 102008005078 B3 6/2009
GB 2234922 A 2/1991

OTHER PUBLICATIONS

Machine Translation of DE 102008005078 B3 ("Audi").*

*Primary Examiner* — Renee S Luebke
*Assistant Examiner* — Paul D Baillargeon
(74) *Attorney, Agent, or Firm* — Murphy, Bilak & Homiller, PLLC

(57) ABSTRACT

A method for producing a contact element includes producing a shaped body having a rectangular main body, a current tapping lug, and an intermediate lug, wherein the main body has first and second longitudinal sides opposite one another in a vertical direction and which respectively extend with a first length in a first horizontal direction, wherein the current tapping lug protrudes away from the first longitudinal side in the vertical direction and extends in the first horizontal direction over a second length which is less than the first length, and wherein the intermediate lug protrudes away from the first longitudinal side in the vertical direction and extends in the first horizontal direction over a third length less than the first length. The intermediate lug is bent over such that at least one portion of the lug comes to lie offset parallel to the main body in a second horizontal direction.

11 Claims, 4 Drawing Sheets

(51) Int. Cl.
*H01R 13/22* (2006.01)
*H01R 25/16* (2006.01)

(56) References Cited

U.S. PATENT DOCUMENTS 8,444,841 B2 * 5/2013 Haga .................. C23C 18/06
 205/118
9,991,644 B2 * 6/2018 Kang .................. H02K 5/225

* cited by examiner

CONTACT ELEMENT, POWER SEMICONDUCTOR MODULE WITH A CONTACT ELEMENT AND METHOD FOR PRODUCING A CONTACT ELEMENT

TECHNICAL FIELD

The present invention relates to a contact element, a power semiconductor module with a contact element and a method for producing a contact element, in particular a contact element for a power semiconductor module.

BACKGROUND

Power semiconductor modules usually have a baseplate in a housing. Arranged on the baseplate are one or more semiconductor substrates. A semiconductor arrangement with a multiplicity of controllable semiconductor components (for example IGBTs) is arranged on at least one of the substrates. A semiconductor substrate generally has an electrically insulating substrate layer (for example a ceramic layer), a first electrically conducting layer (for example a metal layer), which is arranged on a first side of the substrate layer, and, optionally, a second electrically conducting layer (for example a metal layer), which is arranged on a second side of the substrate layer that is opposite from the first side. The controllable semiconductor components are for example arranged on the first electrically conducting layer. The second electrically conducting layer is usually connected to the baseplate, that is to say that it is arranged between the baseplate and the insulating substrate layer.

Contact elements, such as for example load busbars, are arranged in the housing and are electrically connected by a first side to the semiconductor arrangement. A second side of the contact elements usually protrudes upward out of the housing. As a result, the semiconductor arrangement can be electrically contacted from outside the housing.

During the operation of the power semiconductor module, heat is generated. In particular, the contact elements may heat up greatly due to the currents flowing in them. Moreover, inductive effects in the contact elements may lead to a defective distribution of currents. Furthermore, inductive effects in the contact elements may also lead to unwanted oscillations. This can reduce the service life of the semiconductor module and/or adversely influence the function of the semiconductor module.

There is therefore a need for a contact element with which the disadvantages described can be reduced.

SUMMARY

A method for producing a contact element comprises producing a shaped body, wherein the shaped body has a rectangular main body, at least one current tapping lug, and at least one intermediate lug, wherein the main body has a first longitudinal side and a second longitudinal side opposite from the first longitudinal side in the vertical direction, which respectively extend with a first length in a first horizontal direction, wherein each of the at least one current tapping lugs protrudes away from the first longitudinal side of the main body in the vertical direction and extends in the first horizontal direction over a second length, which is less than the first length, and wherein each of the at least one intermediate lugs protrudes away from the first longitudinal side of the main body in the vertical direction and extends in the first horizontal direction over a third length, which is less than the first length. The method comprises furthermore bending over each of the at least one intermediate lugs in such a way that at least one portion of each intermediate lug comes to lie offset parallel to the main body in a second horizontal direction.

A contact element has a main body, wherein the main body has a first longitudinal side and a second longitudinal side opposite from the first longitudinal side in the vertical direction, which respectively extend with a first length in a first horizontal direction. The contact element has furthermore at least one current tapping lug, which is formed in one piece with the main body, protrudes away from the first longitudinal side of the main body in the vertical direction and extends in the first horizontal direction over a second length, which is less than the first length, and has at least one intermediate lug, which is formed in one piece with the main body, is connected to the first longitudinal side of the main body and extends in the first horizontal direction over a third length, which is less than the first length. At least one portion of each of the at least one intermediate lugs is arranged offset parallel to the main body in a second horizontal direction.

A power semiconductor module has a semiconductor substrate, a semiconductor arrangement arranged on the semiconductor substrate, wherein the semiconductor arrangement has at least one semiconductor body, a housing, wherein the semiconductor substrate is arranged in the housing, and at least one contact element, wherein a first end of each of the contact elements is arranged in the housing and a second end of each of the contact elements protrudes out of the housing. Each contact element has a main body, wherein the main body has a first longitudinal side and a second longitudinal side opposite from the first longitudinal side in the vertical direction, which respectively extend with a first length in a first horizontal direction. The contact element has furthermore at least one current tapping lug, which is formed in one piece with the main body, protrudes away from the first longitudinal side of the main body in the vertical direction and extends in the first horizontal direction over a second length, which is less than the first length, and at least one intermediate lug, which is formed in one piece with the main body, is connected to the first longitudinal side of the main body and extends in the first horizontal direction over a third length, which is less than the first length. At least one portion of each of the at least one intermediate lugs is arranged offset parallel to the main body in a second horizontal direction.

Those skilled in the art will recognize additional features and advantages upon reading the following detailed description, and upon viewing the accompanying drawings.

BRIEF DESCRIPTION OF THE DRAWINGS

The invention is explained in more detail below on the basis of examples and with reference to the figures. Here, the same designations refer to the same elements. The representation in the figures is not to scale.

DETAILED DESCRIPTION

In the following detailed description, it is illustrated on the basis of specific examples how the invention can be realized. It goes without saying that, unless otherwise mentioned, the features of the various examples described here can be combined with one another. If certain elements are referred to as "first element", "second element", . . . or the like, the reference to "first", "second", . . . merely serves the purpose of distinguishing different elements from one another. Being referred to in this way does not imply any sequence or enumeration. This means for example that there may be a "second element" even if there is no "first element".

Figure 1:
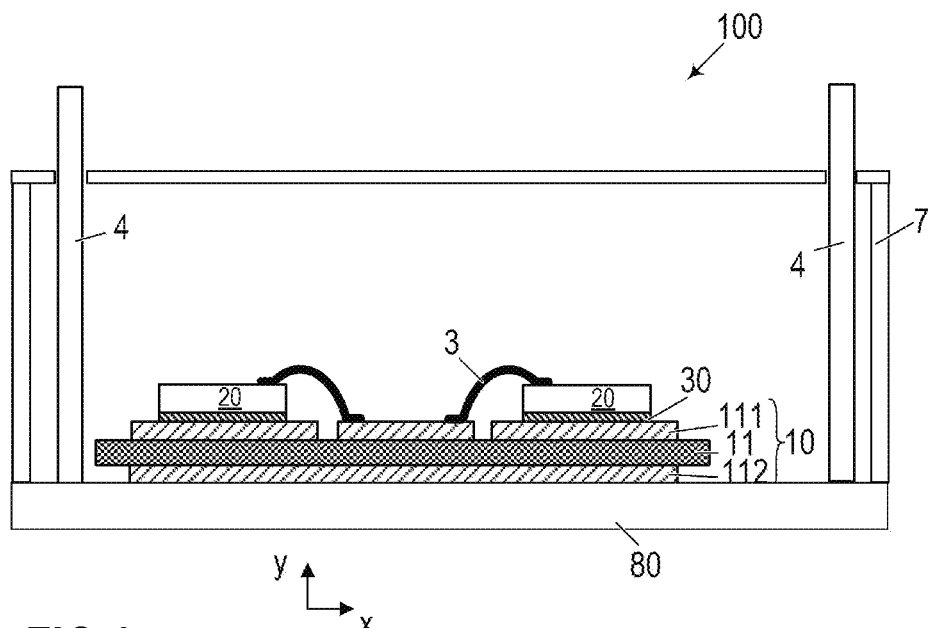
FIG. 1 shows a cross section through a power semiconductor module arrangement.

With reference to FIG. 1, a power semiconductor module 100 with a semiconductor substrate 10 is shown. The semiconductor substrate 10 has a dielectric insulating layer 11, a (structured) first electrically conducting layer 111 and a (structured) second electrically conducting layer 112. The first electrically conducting layer 111 is arranged on a first side of the dielectric insulating layer 11 and the second electrically conducting layer 112 is arranged on a second side of the dielectric insulating layer 12 that is opposite from the first side. The dielectric insulating layer 11 is consequently arranged between the first electrically conducting layer 111 and the second electrically conducting layer 112. The second electrically conducting layer 112 is however optional here. Semiconductor substrates that only have the dielectric insulating layer 11 and the first electrically conducting layer 111 are also known.

Each of the electrically conducting layers, the first layer 111 and the second layer 112, may consist of one of the following materials or comprise one of the following materials: copper; a copper alloy; aluminum; an aluminum alloy; any other metal or any other metal alloy that remains in a solid state during the operation of the power semiconductor module. The semiconductor substrate 10 may be a ceramic substrate, that is to say a substrate in the case of which the dielectric insulating layer 11 consists of ceramic. The dielectric insulating layer 11 may consequently be for example a thin ceramic layer. The ceramic of the dielectric insulating layer 11 may for example consist of one of the following materials or comprise one of the following materials: aluminum oxide; aluminum nitride; zirconium oxide; silicon nitride; boron nitride; or any other ceramic. For example, the dielectric insulating layer 11 may consist of one of the following materials or comprise one of the following materials: $Al_2O_3$, AlN, or $Si_3N_4$. The semiconductor substrate 10 may be for example a so-called Direct Copper Bonding (DCB) substrate, a Direct Aluminum Bonding (DAB) substrate or an Active Metal Brazing (AMB) substrate. The semiconductor substrate 10 may also be for example a conventional circuit board (PCB, printed circuit board) with a non-ceramic dielectric insulating layer 11. A non-ceramic dielectric insulating layer 11 may for example consist of a hardened resin or comprise a hardened resin.

As shown in FIG. 1, one or more semiconductor bodies 20 may be arranged on the semiconductor substrate 10. Each of the semiconductor bodies 20 on the semiconductor substrate 10 may comprise a diode, an IGBT (insulated-gate bipolar transistor), a MOSFET (metal oxide semiconductor field-effect transistor), a JFET (junction gate field-effect transistor), an HEMT (high-electron-mobility transistor), or any other suitable controllable semiconductor component. The one or more semiconductor bodies 20 may form a semiconductor arrangement on the semiconductor substrate 10. In FIG. 1, only two semiconductor bodies 20 are shown by way of example.

The first electrically conducting layer 111, shown in FIG. 1, is a structured layer. "Structured layer" means in this connection that the first electrically conducting layer 111 is not a continuous layer but has interruptions between various regions of the layer. Various semiconductor bodies 20 may be arranged on the same region or on different regions of the first electrically conducting layer 111. The various regions of the first electrically conducting layer 111 may either not have any electrical connection to one another or may be electrically connected to one another, for example by means of bonding wires 3. Each of the semiconductor bodies 20 may be electrically and mechanically connected to the semiconductor substrate 10 by means of an electrically conducting connecting layer 30. FIG. 1 shows by way of example a semiconductor substrate 10 with connecting layers 30 arranged on it. Each of the electrically conducting connecting layers 30 may in principle be a solder layer, a layer of an electrically conducting adhesive or a layer of a sintered metal powder, for example a sintered silver powder.

The semiconductor substrate 10 is arranged on a baseplate 80. The baseplate 80 may for example form the base of a housing 7. The housing 7 may have furthermore side walls and a cover. The semiconductor substrate 10 with the semiconductor arrangement arranged on it is protected from a wide variety of environmental influences by the housing 7. For example, the housing 7 protects the semiconductor arrangement from mechanical damage. Moreover, the housing 7 protects the metal components of the semiconductor arrangement in particular, for example from moisture and harmful gases.

In order that the semiconductor arrangement can be electrically contacted from outside the housing 7, the power semiconductor module has furthermore at least one contact element 4. For example, a supply voltage for the semiconductor arrangement can be provided by way of the contact elements 4. Each of the contact elements 4 protrudes with a first end into the housing 7 and is electrically connected there to the semiconductor arrangement. In FIG. 1, only one mechanical connection between the contact elements 4 and the baseplate 80 is shown for the sake of simplicity. Electrical connections within the housing 7 on the other hand are not explicitly shown. Instead of being connected to the baseplate 80, the contact elements 4 may however also be mechanically connected for example to the semiconductor substrate 10. Furthermore, it is also possible for example that the contact elements 4 are arranged in the side walls of the housing 7. A second end of the contact elements 4 protrudes upward out of the housing 7. For this, the housing 7 generally has openings in the cover, through which the contact elements 4 protrude. In FIG. 1, smaller intermediate spaces between the housing cover and the contact elements 4 are shown. Such intermediate spaces are however usually sealed off by suitable seals or sealing materials (not shown), in order to prevent penetration of moisture and gases into the interior of the housing 7.

Figure 2:
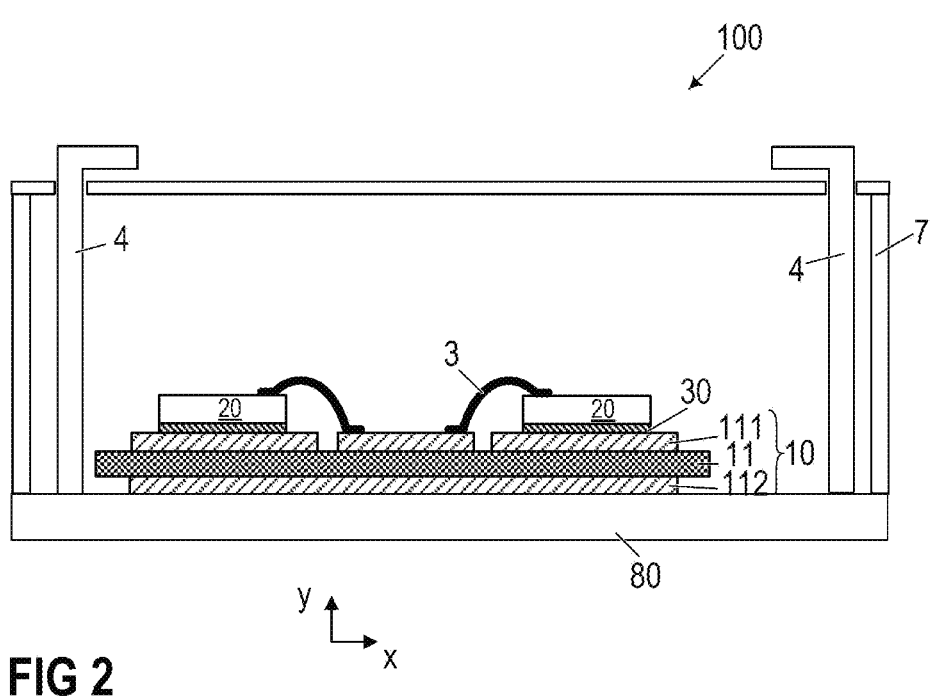
FIG. 2 shows a cross section through a power semiconductor module arrangement.

In FIG. 1, the contact elements 4 protrude perpendicularly upward out of the housing 7B. However, this is only an example. For example, first all of the components (semiconductor substrate 10, semiconductor arrangement, contact elements 4, etc.) may be arranged on the baseplate 80. Subsequently, the housing 7 may be arranged on the baseplate 80. When doing so, the contact elements 4 may be pushed through the openings in the housing 7. The upper end of the contact elements 4, which then protrudes out of the housing 7, may subsequently be bent over, for example by 90°, out of its original position. This is shown by way of example in FIG. 2. A bending over of the upper ends may for example facilitate electrical contacting of the contact elements 4.

Figure 3:
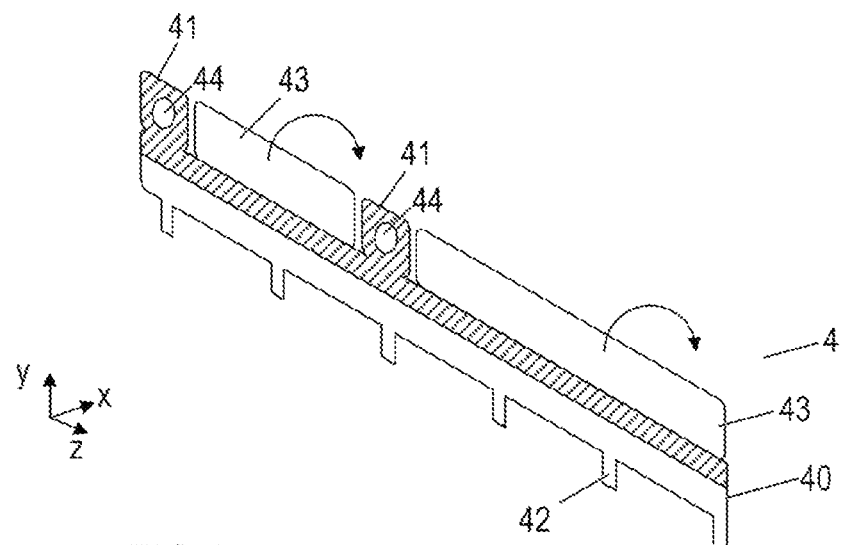
FIG. 3 shows a perspective view of a contact element.

FIG. 3 shows a perspective view of a contact element 4 that is given by way of example. The contact element 4 is for example a so-called load busbar. The contact element 4 has a first longitudinal side and a second longitudinal side opposite from the first longitudinal side, which extend in a horizontal direction z. The contact element 4 has furthermore a first transverse side and a second transverse side opposite from the first transverse side, which respectively extend in a vertical direction y between the first and second longitudinal sides. In FIG. 3, the longitudinal and transverse sides thus form a rectangular main body 40. However, other shapes of the main body 40 are likewise possible in principle. A thickness of the contact element 4 in a second horizontal direction x is thin in comparison with a length in the first horizontal direction z.

The contact element 4 has furthermore current tapping lugs 41, which protrude away from the main body 40 in the vertical direction y, in particular away from the first longitudinal side. In FIG. 3, two current tapping lugs 41 are schematically shown. However, this is only an example. Any number N of current tapping lugs 41 is possible in principle, with N≥1. The contact element 4 has furthermore intermediate lugs 43. The intermediate lugs 43 likewise protrude away from the first longitudinal side in the vertical direction y. Each of the intermediate lugs 43 is generally arranged between two current tapping lugs 41 in the first horizontal direction z. Each of the current tapping lugs 41 may for example have an opening 44. A contact pin or the like may for example be led through the opening 44, in order to electrically contact the contact elements 4.

In FIG. 3, both the current tapping lugs 41 and the intermediate lugs 43 are shown in one plane with the main body 40. However, this is usually only an intermediate state. In the further course of the procedure, at least the intermediate lugs 43 are folded out of their starting position, as will be further explained later (indicated in FIG. 3 by the arrows). The contact element 4 may also have furthermore at least one contact region 42. The at least one contact region 42 is connected to the second longitudinal side of the main body 40 and protrudes away from it in the vertical direction y. The contact regions 42 are for example designed to be mechanically and electrically connected to a baseplate 80 and/or a semiconductor substrate 10. For example, a welded connection may be produced between the contact regions 42 and the baseplate 80 and/or the semiconductor substrate 10. Any other suitable connections are likewise possible. In this case, the contact element 4 may be connected by way of the contact regions 42 directly to the baseplate 80 and/or to the semiconductor substrate 10. However, it is also possible that additional structures and connecting elements (not shown) that are mechanically and electrically connected to the contact regions 42 are arranged on the baseplate 80 and/or the semiconductor substrate 10.

The contact element 4 may comprise a metal, such as for example copper. Furthermore, the contact element 4 may for example be at least partially coated with a thin layer of another material, for example nickel. Regions that are coated with a further material are shown by way of example in FIG. 3 in dashed lines. For example, such regions of the contact element 4 that protrude out of the housing 7 in the finished arrangement may be nickel-coated. As a result, these parts can be protected from corrosion. However, it is also possible to coat such regions of the contact element 4 that do not protrude out of the housing 7 in the assembled state of the arrangement with a layer of protective material.

With reference to FIGS. 4A-4D, a method for producing a contact element 4 is described by way of example. The contact element 4 may for example be produced from a blank. Such a blank is shown by way of example in FIG. 4A. The blank may for example be a metal strip and have a first length L1 in the first horizontal direction z. The blank may for example be coated fully, partially or not at all with an additional layer of material. In the example in FIG. 4A, the blank is partially coated with a layer of material (shown in FIG. 4A in dashed lines).

Figure 4A:
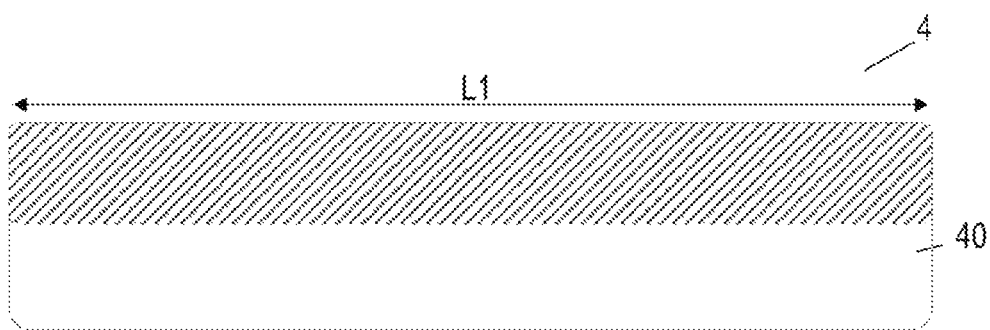
FIGS. 4A-4D show a method for producing a contact element according to one example.
Figure 4A:
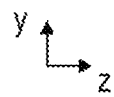
Figure 4B:
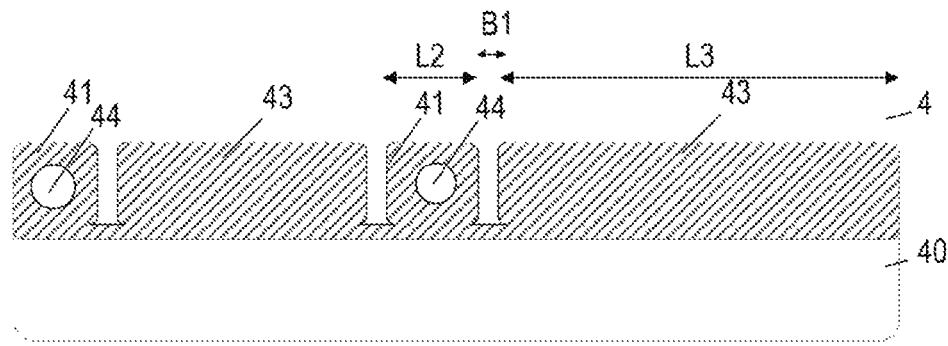

With reference to FIG. 4B, a shaped body can be produced from the blank. For example, the shaped body can be punched or cut out from the blank. As already described above with respect to FIG. 3, the shaped part has a main body 40, at least one current tapping lug 41 and at least one intermediate lug 43. The at least one current tapping lug 41 and the at least one intermediate lug 43 are for example arranged alternately along a first longitudinal side of the main body 40. The main body 40 has a first longitudinal side and a second longitudinal side arranged opposite from the first longitudinal side. The first and second longitudinal sides extend over the first length L1 in the first horizontal direction z. Since the shaped body is punched or cut from the blank, the main body 40, the at least one current tapping lug 41 and the at least one intermediate lug 43 are formed in one piece. That is to say that the main body and the lugs 41, 43 are formed from a continuous piece of material. The punching or cutting generally produces intermediate spaces between the current tapping lugs 41 and the intermediate lugs 43. These intermediate spaces may for example have a width B1 in the horizontal direction z. The width B1 may for example be between 0.5 and 1.5 mm.

The first length L1 may be for example between 15 and 30 cm. For example, the first length L1 may be 21.5 cm. Each of the current tapping lugs 41 may have a second length L2 in the horizontal direction z, which is less than the first length L1. For example, the second length L2 may be between 10 mm and 50 mm. The second length L2 may for example depend on how many holes 44 each of the current tapping lugs 41 has. In the figures, current tapping lugs 41 with in each case one hole 44 are shown. However, it is also possible that each of the current tapping lugs 41 has more than one hole 44, which are arranged next to one another in the first horizontal direction z (for example two holes). The more holes 44 a current tapping lug 41 has, the greater its length L2 can be. It is in this case also possible that a contact element 4 has current tapping lugs 41 of different lengths. For example, one current tapping lug 41 may have a length L2 of 18 mm and another current tapping lug 41 may have a length L2 of 35 mm.

Each of the at least one intermediate lugs 43 may have a third length L3. The third length L3 may be for example between 3 cm and 8 cm. However, according to a further example, the length L3 may also be between 3 cm and 18 cm. For example, the third length L3 may be 5.5 cm.

Figure 4D:
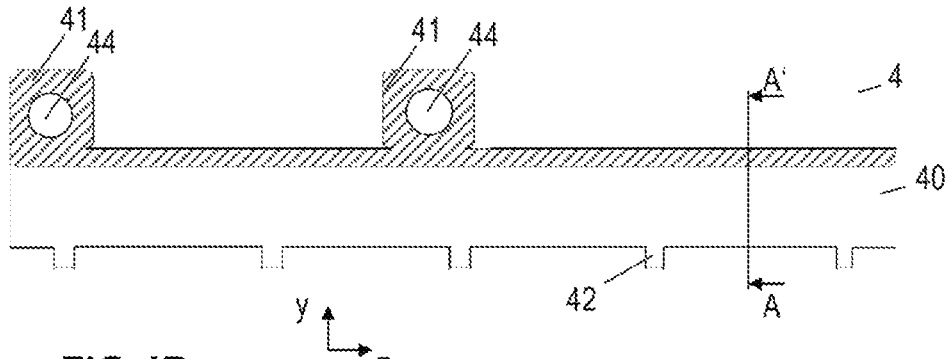
Figure 5A:
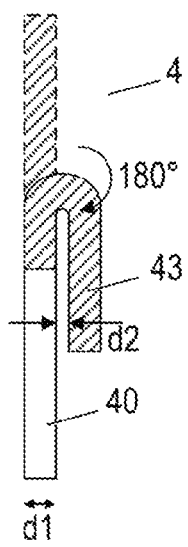
FIGS. 5A-5C shows various cross-sections of contact elements given by way of example.
Figure 5B:
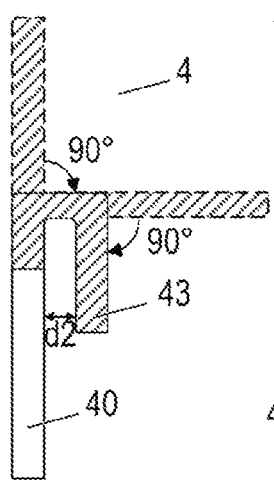
Figure 5C:
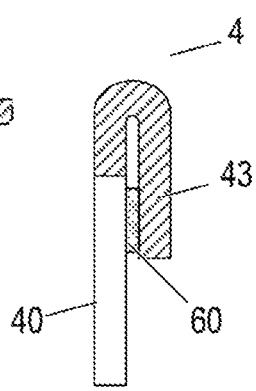

As shown by way of example in FIG. 5A, the contact element 4 may have in the second horizontal direction×a thickness d1, which is small in comparison with the first length L1. For example, the thickness d1 may be between 0.5 mm and 2 mm. For example, the thickness d1 may be 1 mm. FIGS. 5A-5C show example cross-sections of the contact element from FIG. 4D in a sectional plane A-A'.

Figure 4C:
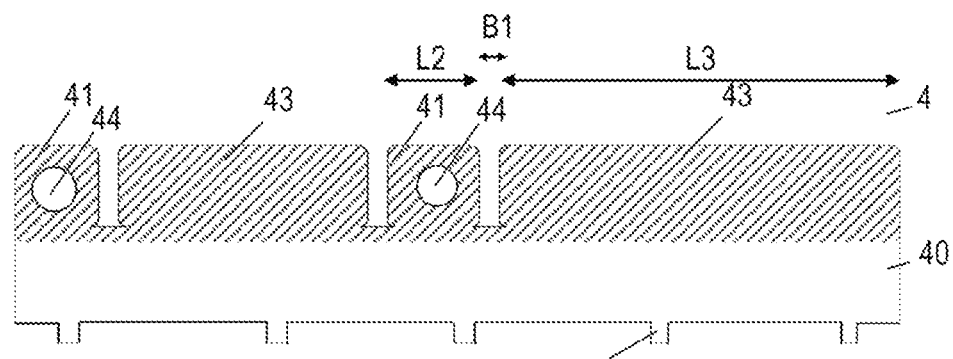

Optionally, the shaped part may also have contact regions 42, as shown by way of example in FIG. 4C. Such contact regions 42 may be produced in the same step as the current tapping lugs 41 and the intermediate lugs 43. It is however also possible that contact regions 42 are produced in an additional step. For example, the contact regions 42 may also be produced by means of punching or cutting.

With reference to FIG. 4D, the intermediate lugs 43 are bent over in a further step. As shown by way of example in FIG. 5A, the intermediate lugs may be bent by 180° out of their starting position, so that the intermediate lug 43 is arranged offset parallel to the main body 40 in the second horizontal direction x. All that remains may be a small connecting piece, which connects the intermediate lug 43 to the main body 40. The intermediate lug 43 may lie directly against the main body 40. That is to say that a distance d2 between the intermediate lug 43 and the main body 40 may be zero (for example indicated in FIG. 5A). However, it is likewise possible that a distance d2 that is greater than zero is created between the main body 40 and the intermediate lug 43. For example, each of the intermediate lugs 43 may have a first portion and a second portion, which first are both bent by 90° out of their starting position. Subsequently, the second portion may be bent once again by a further 90°. The first portion is in this case arranged between the second portion and the main body 40 and connects them to one another. After the bending, the first portion extends perpendicularly to the main body 40. After the bending, the second portion extends offset parallel to the main body 40 in the second horizontal direction x (cf. for example FIG. 5B). A distance d2 between the second portion and the main body 40 is >0. For example, the second distance d2 may be between 0.1 mm and 1.5 mm.

As shown in FIG. 5C, the intermediate lug 43 may optionally be connected to the main body 40 by an additional connecting element 60. As a result, it can for example be ensured that the intermediate lug 43 remains in its position after the bending. For example, the connecting element 60 may comprise a clinched connection. Clinching methods are also known for example as press joining. However, any other suitable connecting elements 60 are likewise possible.

The method described allows the amount of scrap during the production of the contact element 4 to be kept low. The portions of the blank that are arranged between the current tapping lugs 41 are not removed, but are used as intermediate lugs 43, by bending over to increase the cross section of the contact element 4. In particular in the portions of the main body 40 between the current tapping lugs 41, the temperature often increases particularly greatly during operation. By increasing the cross section of the contact element 4 in these regions, it is possible to achieve the effect that the temperature increases less greatly because of the increased cross section. The contact element 4 consequently provides a very stable and reliable solution at low costs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a contact element, the method comprising:
   producing a shaped body having a rectangular main body, at least one current tapping lug, and at least one intermediate lug, wherein the main body has a first longitudinal side and a second longitudinal side opposite the first longitudinal side in a vertical direction, and which respectively extend with a first length in a first horizontal direction, wherein each of the at least one current tapping lug has a proximal end originating at the first longitudinal side of the main body, protrudes away from the first longitudinal side of the main body in the vertical direction and extends in the first horizontal direction over a second length which is less than the first length, and wherein each of the at least one intermediate lug has a proximal end originating at the first longitudinal side of the main body, protrudes away from the first longitudinal side of the main body in the vertical direction and extends in the first horizontal direction over a third length which is less than the first length; and
   bending over each of the at least one intermediate lug such that at least one portion of each intermediate lug comes to lie offset parallel to the main body in a second horizontal direction.

2. The method of claim 1, wherein producing the shaped body comprises punching a flat metal body or cutting a flat metal body to size.

3. The method of claim 2, wherein the punching or cutting to size of the flat metal body comprises:
   removing at least one first intermediate region between the at least one first current tapping lug and the at least one intermediate lug.

4. The method of claim 1, wherein the bending over of the at least one intermediate lug comprises:
   bending over the at least one intermediate lug by 180° from a starting position.

5. The method of claim 1, wherein the bending over of the at least one intermediate lug comprises:
   bending over a first portion and a second portion of each intermediate lug by 90° from a starting position of the intermediate lug; and
   bending over the second portion of each intermediate lug by a further 90°, so that the second portion comes to lie offset parallel to the rectangular main body in the second horizontal direction, wherein the first portion is arranged between the second portion and the main body.

6. The method of claim 1, wherein the shaped body further comprises at least one contact region protruding away from the second longitudinal side of the main body in the vertical direction.

7. The method of claim 1, further comprising:
   at least partially coating the shaped body with a layer of a material that differs from a material of the shaped body.

8. The method of claim 1, further comprising:
   producing an electrical connection between the contact element and a semiconductor arrangement, wherein the semiconductor arrangement has at least one semiconductor body.

9. A contact element, comprising:
   a shaped body having a rectangular main body, at least one current tapping lug, and at least one intermediate lug,
   wherein the main body has a first longitudinal side and a second longitudinal side opposite the first longitudinal side in a vertical direction, and which respectively extend with a first length in a first horizontal direction,
   wherein each of the at least one current tapping lug has a proximal end originating at the first longitudinal side of the main body, protrudes away from the first longitudinal side of the main body in the vertical direction and extends in the first horizontal direction over a second length which is less than the first length, wherein each of the at least one intermediate lug has a proximal end originating at the first longitudinal side of the main body, protrudes away from the first longitudinal side of the main body in the vertical direction and extends in the first horizontal direction over a third length which is less than the first length, wherein each of the at least one intermediate lug is bent over such that at least one portion of each intermediate lug lies offset parallel to the main body in a second horizontal direction.

10. The contact element of claim 9, wherein the shaped body further comprises at least one contact region protruding away from the second longitudinal side of the main body in the vertical direction.

11. The contact element of claim 9, wherein the shaped body is at least partially coated with a layer of a material that differs from a material of the shaped body.

* * * * *